United States Patent [19]
Bertolet et al.

[11] Patent Number: 5,734,582
[45] Date of Patent: Mar. 31, 1998

[54] METHOD AND SYSTEM FOR LAYOUT AND SCHEMATIC GENERATION FOR HETEROGENEOUS ARRAYS

[75] Inventors: Allan Robert Bertolet, Williston; Kim P. N. Clinton, Essex Junction; Scott Whitney Gould, Burlington; Frank Ray Keyser, III, Colchester; Timothy Shawn Reny, Underhill Center; Terrance John Zittritsch, Williston, all of Vt.

[73] Assignee: International Business Machines Corporation, Armonk, N.Y.

[21] Appl. No.: 570,850

[22] Filed: Dec. 12, 1995

[51] Int. Cl.$^6$ .................................................. G06F 17/50
[52] U.S. Cl. .................................. 364/490; 364/491
[58] Field of Search ........................ 364/488, 489, 364/490, 491; 326/37, 38, 39, 41, 47, 101; 340/825.83, 825.85, 825.86

[56] References Cited

U.S. PATENT DOCUMENTS

| | | | |
|---|---|---|---|
| 4,393,474 | 7/1983 | McElroy | 365/200 |
| 4,642,487 | 2/1987 | Carter | 307/465 |
| 4,688,072 | 8/1987 | Heath et al. | 357/45 |
| 4,796,224 | 1/1989 | Kawai et al. | 365/51 |
| 4,870,598 | 9/1989 | Shaw et al. | 364/491 |
| 4,978,633 | 12/1990 | Seefeldt et al. | 437/51 |
| 5,119,158 | 6/1992 | Hatano | 357/40 |
| 5,144,166 | 9/1992 | Camarota et al. | 307/465.1 |
| 5,212,652 | 5/1993 | Agrawal et al. | 364/489 |
| 5,341,049 | 8/1994 | Shimizu et al. | 307/482.1 |
| 5,359,537 | 10/1994 | Saucier et al. | 364/489 |
| 5,461,577 | 10/1995 | Shaw et al. | 364/491 |
| 5,463,328 | 10/1995 | Cope et al. | 326/41 |
| 5,625,301 | 4/1997 | Plants et al. | 326/41 |

*Primary Examiner*—Kevin J. Teska
*Assistant Examiner*—Leigh Marie Garbowski
*Attorney, Agent, or Firm*—Heslin & Rothenberg, P.C.

[57] ABSTRACT

A method and system for defining, placing and routing kernels for a family of integrated circuits is provided. The integrated circuits are defined using repeatable row and column circuit types. Kernels are defined by the intersections of the row and column circuit types in the array. The kernels are placed and routed automatically for each member of the family of integrated circuit arrays, each member being generally characterized by a different size, i.e., a different number of repeatable row or column circuit types.

32 Claims, 5 Drawing Sheets

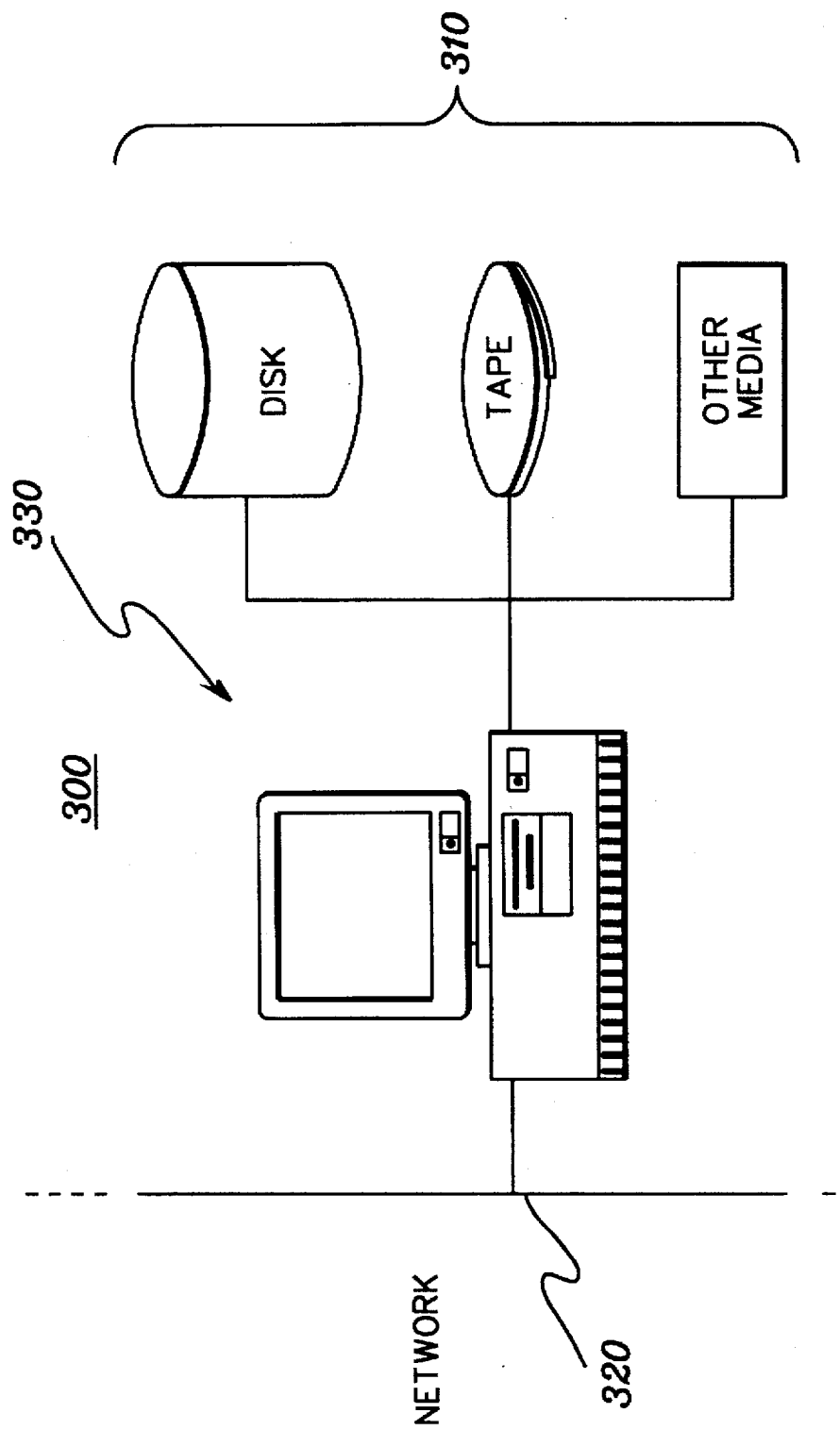

METHOD AND SYSTEM FOR LAYOUT AND SCHEMATIC GENERATION FOR HETEROGENEOUS ARRAYS

RELATED APPLICATION INFORMATION

This application relates to commonly-owned previously filed U.S. patent applications:

1. Ser. No.: 08/460,481, filed Jun. 2, 1995, entitled "PROGRAMMABLE LOGIC CELL;" now U.S. Pat. No. 5,646,546, Jul. 8, 1997.

2. Ser. No.: 08/459,156, filed Jun. 2, 1995, entitled "PROGRAMMABLE ARRAY CLOCK/RESET RESOURCE;" now U.S. Pat. No. 5,652,529, Jul. 29, 1997.

3. Ser. No.: 08/460,420, filed Jun. 2, 1995, entitled "PROGRAMMABLE ARRAY I/O-ROUTING RESOURCE;"

4. Ser. No.: 08/459,579, filed Jun. 2, 1995, entitled "PROGRAMMABLE ARRAY INTERCONNECT NETWORK;" now U.S. Pat. No. 5,631,578, May 20, 1997.

5. Ser. No.: 08/488,314, filed Jun. 7, 1995, entitled "CONTINUOUS ADDRESS STRUCTURE WITH FOLDING;" and 6. Ser. No.: 08/528,177, filed Sep. 14, 1995, entitled "METHODS AND SYSTEMS FOR IMPROVING MEMORY COMPONENT SIZE AND ACCESS SPEED, INCLUDING SPLITTING BIT LINES AND ALTERNATE PRE-CHARGE/ACCESS CYCLES."

The section entitled "Description of the Preferred Embodiment(s)," and the drawings, from each of the above-referenced related U.S. patent applications are hereby expressly incorporated herein by reference.

TECHNICAL FIELD

This invention relates in general to integrated circuit design and fabrication, and more particularly to automated placement and routing for layout and schematic generation for a family of integrated circuits having varying sizes.

BACKGROUND OF THE INVENTION

Integrated circuit ("IC") design and fabrication often involves a transfer of digital information from a circuit designer to fabrication facilities or foundries. The circuit designer must prepare a digital representation of circuit layout information in a format suitable for use by the foundry. Circuit designers also often use such digital circuit representations internally for automated schematic generation for verification and/or test of proposed circuit designs.

However, the current process by which circuit designers generate such digital representations from customer specifications is primarily manual in nature. The circuit designer must first manually design an appropriate circuit to meet a customer's functional and timing specifications. A designer must then manually lay out, or place and wire, the requisite components of a proposed circuit in an area and location of silicon which is commensurate with the customer's specifications. Computer-aided-design tools are currently available which facilitate this design process, however, the majority of the task is still very much a manual undertaking.

The customer specifications may also include fabrication of scaleable integrated circuit architectures. Field programmable gate arrays ("FPGAs") are an example of an architecture which may be considered scaleable or growable. At the device level, FPGAs are heterogeneous in nature, i.e., they are not comprised of a pure repetition of a single type of circuit. FPGAs rather comprise a multitude of different circuit types, which when viewed at higher levels of circuit type grouping, may be considered repetitive or scaleable. For example, a sector of FPGA logic cells may be defined as an M×N grouping of logic cells. A customer may require a family of ICs having 3×3, 5×5, 7×7, 9×9 . . . sectors. A customer may therefore specify that the same basic building blocks of an FPGA (e.g., a sector) be provided, but that multiple ICs be made available having a range of sizes measured in sectors. Multiple FPGA sizes may comprise an IC "family" which is often a useful way to market FPGAs to a user base.

However, from the standpoint of a circuit designer, an FPGA must be considered a collection of generally disparate circuit types (logic cells, interconnect, repeaters, etc.), because of the complexity and wiring requirements of each of these circuit types. To support fabrication of an FPGA family, multiple transfers of digital information to the foundry are required, one such transfer for each IC size. Using the known circuit design techniques discussed above, a primarily manual layout or place and wire procedure is necessary for each IC size. Thus, despite the apparent repetitive nature of FPGA circuits when viewed at higher levels, a designer must perform manual place and wire techniques for each IC size.

A method and system are thus required which automate the process by which a family of heterogeneous ICs can be designed and fabricated without unduly burdensome repetition of manual design and place and wire procedures.

SUMMARY OF THE INVENTION

The shortcomings of the prior art are overcome and additional advantages provided by the present invention, which in one aspect is a method for heterogeneous array design including defining a plurality of column circuit types, each column circuit type having associated therewith a column width, at least two of the column widths being different, and defining a plurality of row circuit types, each row circuit type having associated therewith a row height, at least two of the row heights being different. The pluralities of row and column circuit types are allocated to respective row and column regions in the array. The allocated pluralities of row and circuit types thereby form a plurality of intersecting regions across the array. Circuits are arranged into kernels corresponding to respective intersecting regions, according to the width of the column circuit type and the height of the row circuit type which form the respective intersecting regions.

The method may further include placing each respective arranged kernel in the array according to a two-dimensional coordinate system having an origin. A first coordinate is determined as a function of the widths of the allocated column types between the origin and the respective intersecting region. A second coordinate is determined as a function of the heights of the allocated row types between the origin and the respective intersecting region.

The step of placing the arranged kernels may be repeated for each member of a family of heterogeneous arrays, each member being generally characterized by the number and types of row and column circuit types allocated thereto. In this respect, the present invention provides an automated place and route, and layout and schematic generation technique, for designing differently sized members of an array family.

In another aspect of the invention, a method and system are provided for placing a plurality of kernels in a heterogeneous array, the array being characterized by a plurality of columns, each column having a column circuit type, and a plurality of rows, each row having a row circuit type. The method and system include describing a plurality of kernel types, the plurality of kernels being grouped within the kernel types of the plurality of kernel types. At least one kernel type is generally defined by the intersection of a column having a given column circuit type and a row having a given row circuit type. At least one kernel placement position is calculated for a kernel of the at least one kernel type. The placement position is calculated as a function of the location in the array of the column having the given column circuit type and the row having the given row circuit type.

Kernel positions for all remaining kernels of the at least one kernel type may be calculated, the number of remaining kernels of the at least one kernel type being determined as a function of the number in the array of each row and column circuit type by which the at least one kernel type is defined. Further, kernel positions for the kernels of the remaining kernel types may be calculated, the number of kernels of each remaining kernel type being determined as a function of the number in the array of each row and column circuit type by which the respective kernel type is defined.

A first coordinate of the calculated placement position and a second coordinate of the calculated placement position may correspond to distances from an origin in a two-dimensional coordinate system used to lay out the array. In this case, the calculating includes determining, for the first coordinate, the number, type and width of any columns between the column and the origin; and determining, for the second coordinate, the number, type and height of any row between the row and the origin.

The heterogeneous array may comprise a plurality of logic cells partitioned into sectors, each sector being defined by the intersection of a plurality of adjacent columns and a plurality of adjacent rows, the plurality of adjacent columns having a given sequence of column circuit types and the plurality of adjacent rows having a given sequence of row circuit types. In this case, the providing and calculating placement positions are repeated for each member of a family of heterogeneous circuit arrays, each member of the family being generally characterized by the number of sectors therein.

In yet another aspect of the invention, an architecture for a family of differently sized programmable arrays is provided. Each member of the family has a plurality of logic cells and support circuitry therein. The logic cells are arranged in four sections, and the support circuitry is generally distributed throughout a cruciform-shaped region generally centered in the array and which defines the four sections of logic cells. The length of the arms of the cruciform and the sizes of the sections can be together varied to produce the differently sized members of the family of programmable arrays.

By employing the methods and systems of the present invention, a family of heterogeneous ICs can be designed and fabricated without repetition of manual design and place and wire procedures. Layout and schematic generation is automated for each member of the IC family.

BRIEF DESCRIPTION OF THE DRAWINGS

The subject matter regarded as the present invention is particularly pointed out and distinctly claimed in the concluding portion of the specification. The invention, however, both as to organization and method of practice, together with further objects and advantages thereof, may best be understood by reference to the following detailed description of preferred embodiment(s) and the accompanying drawings in which:

FIG. 5 depicts an exemplary workstation environment within which the principles of the present invention can be implemented.

DETAILED DESCRIPTION OF THE PREFERRED EMBODIMENTS

Layout and schematic generation has been a primarily manual task for each member of a family of ICs. The present invention provides a technique which automates this task. Row and column circuit types are defined and allocated across an array. Circuits are arranged into kernels in the regions formed by row and column intersections. The number and sequence of row and column circuit types is used to automatically locate each kernel. Using these techniques, layout and schematic generation can be automatically performed for an arbitrarily sized IC. FPGAs are disclosed herein as an exemplary type of IC for which these techniques can be used.

Figure 1:
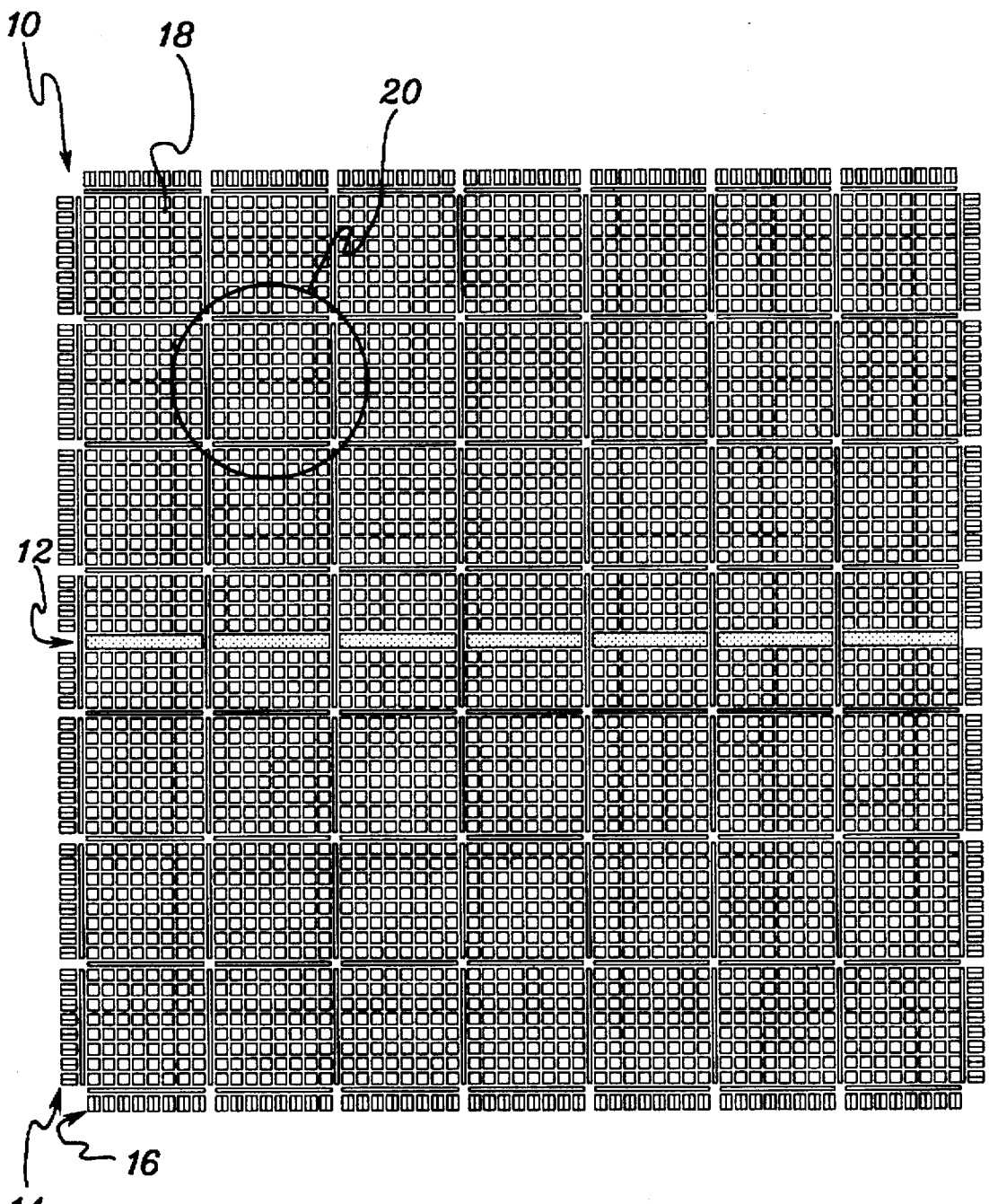
FIG. 1 depicts a 7×7 sector member of an FPGA family designed and fabricated according to the principles of the present invention.

FIG. 1 depicts an FPGA 10 designed and fabricated in accordance with the principles of the present invention. Array 10 represents one member of a family of FPGAs to be made available to customers or users. Array 10 is a 7×7 sector member of a family which may include a 3×3 sector member, a 5×5 sector member, etc.

The array can be generally characterized as a symmetrical array of logic or core cells 18 which are grouped into sectors 20. Therefore, at this high level, it is apparent that the family of arrays can be described in terms of the number of sectors in each linear dimension. However, as discussed above, and as disclosed in detail in the commonly-owned related applications above, the array is in fact a heterogeneous array comprising a variety of subsystems including the logic cells, clock/reset resources, interconnect resources, etc., most of which are not discernable upon examination of FIG. 1. The term "array" denotes either the entirety of the circuits on a single IC chip, multiple IC chips, or could denote merely a portion of circuits of a larger circuit.

FIG. 1 also depicts a central region 12 within which support circuitry is contained for the array. The horizontal region 12 can be complemented with a similar vertical region (not shown) which together form a cruciform imposed on the array. Around the perimeter of the chip are placed I/O regions 14 and 16. The circuits forming these I/O regions are disclosed in the above-referenced related application entitled "PROGRAMMABLE ARRAY I/O-ROUTING RESOURCE."

Members of an FPGA IC family are designed in accordance with the principles of the present invention using layout and schematic building blocks or kernels. The kernels are placed and wired using procedures (discussed below) to produce the completed IC. The kernels are generally common to all ICs of the family. Multiple IC sizes can be created using the procedures discussed below in connection with FIGS. 3 and 4. The place and wire procedures automate the process of producing multiple members of a family of IC chip sizes based on the same set of kernels by taking as an input parameter the chip size and placing and wiring the appropriate kernels to produce the desired IC size. The output of the place and wire procedure is completed layout and schematic IC data, for subsequent use by the fabrication facility and the designer for verification/test.

Figure 2:
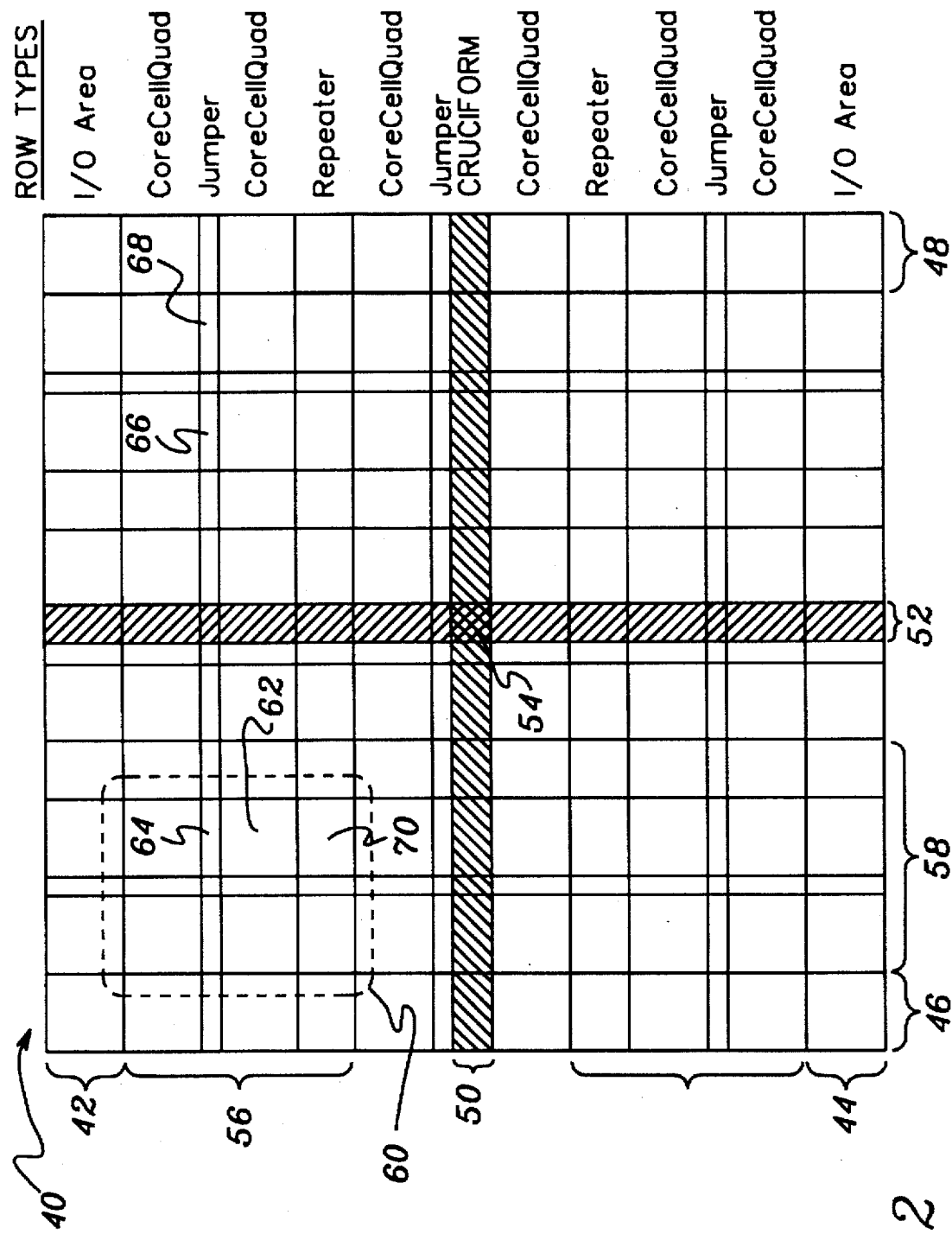
FIG. 2 depicts the row and column types for a 3×3 sector FPGA defined in accordance with the principles of the present invention.

With reference to FIG. 2, shown therein is an exemplary 3×3 sector member of a family of arrays provided in accordance with the principles of the present invention. The circuits comprising the array 40 are shown generally grouped into column or row types. Thus, the IC is divided into column and row regions within which are allocated column and row types of circuits. Column widths are not the same across columns but are constant for the entire height of any one column. Row heights are not the same across rows but are constant for the width of any one row.

The array 40 depicted in FIG. 2 is designed with five column/row types defined in accordance with the invention. The column/row types are:

CoreCellQuad: CoreCellQuad columns and rows contain data for a 4×4 array of core cells. This is referred to as a four cell quadrant. The number of CoreCellQuad type columns/rows varies with IC size requirements.

Repeater: Repeater columns and rows contain repeater data. Repeaters are structures in the interconnect resource which buffer, re-direct, and re-drive interconnect signal data. The number of repeater type columns/rows varies with IC size requirements.

Jumper: Jumper columns contain jumper data and jumper rows contain jumper data and sector clock circuitry. Jumpers are also part of the interconnect network and effect connection between interconnect wires. Sector clock circuitry includes circuitry employed to distribute reset and clock signals to core cells. The number of jumper type columns/rows varies with IC size requirements.

IO area: IO area columns and rows contain input/output blocks, input/output routing and outermost repeater data. All IC sizes likely have two IO area columns (left and right perimeter edges) and two IO area rows (top and bottom perimeter edges).

Cruciform: There is one cruciform column and one cruciform row for each IC. The cruciform column contains word line drivers, dedicated IO and configuration logic. The cruciform row contains bit line drivers, global clock circuitry and dedicated IO.

The sequence of column types from left to right for the array shown corresponds to the sequence of row types shown from top to bottom, although this not a requirement of the invention for other arrays.

IO area rows 42 and 44 are depicted in FIG. 2. IO area columns 46 and 48 are also depicted in FIG. 2. Cruciform areas 50 and 52 are depicted, and intersect in region 54. The remaining types of columns or rows are depicted and labeled as they occur throughout the embodiment of this particular array. Sector 60 is formed from intersections of the sequence of rows 56 and the sequence of columns 58.

One aspect of the present invention is evident upon an examination of FIGS. 1 and 2. The cruciform region contains four "arms" which extend from the center of the array. The support circuitry disposed in this region can support a scaleable architecture because the length of each arm (e.g., the number of bit line or word line drivers) can be expanded outward. The expansion of these arms does not interfere with the outward expansion of the sectors. Thus, the expansion of the four sector regions defined by the cruciform, and the cruciform itself, contribute to the overall scaleability of the architecture.

The IC layout and schematic information is generated in accordance with the present invention by placing kernels at the intersections of the columns and rows. Columns and rows can thus be considered as segmented by the type of kernel being placed therein. For example, a column where the kernel placed is a repeater, is a repeater column, or if the kernel is a jumper, it is a jumper column. Kernel 64 represents the intersection between a CoreCellQuad column and a jumper row. Similarly, kernel 62 represents the intersection between a CoreCellQuad column and a CoreCellQuad row. Thus, the overall number of kernels in the IC is simply a multiplication of the number of rows times the number of columns. However, many of the kernels can be grouped into kernel types based upon the intersection of common types of columns and rows. As an example, since there are five column types and five row types in this exemplary embodiment, there are twenty-five different kernel types with twenty-five distinctive shapes. Thus, kernels 64, 66 and 68 can be grouped into a common kernel type because they all represent the intersection of a CoreCellQuad column with a jumper row. The placement procedure, discussed below, cycles through all column and row intersections for a given kernel type and processes, i.e., places and wires, the appropriate kernel for that intersection. As the IC sizes change, columns and rows are simply added and subtracted from the chip in a known sequence. However, the place and wire procedure remains automated.

The IC's logical architecture is designed to allow logical elements to be grouped into physical blocks. These blocks are located in repeatable patterns around the chip. The repeatable patterns are based on the kernel columns and rows. The physical size of each kernel type is determined by the width of the column where it will be placed and the height of the row where it will be placed. As an example, at the intersection of a CoreCellQuad column and a repeater row, the kernel 70 placed there must have the width of four core cells and height of one repeater. This is a design constraint in force when the kernel types are developed.

Kernels are designed using industry standard techniques. Manual entry is the primary method utilized. A few kernels are designed using high level descriptions and automatic place and route tools. Kernels types may have multiple versions therein. An additional version of a kernel type is required if small changes are required to be made to a kernel within the kernel type based on its particular placement location. Examples of changes prompting the requirement of multiple versions are device sizes, internal pin connections, and via placement. Device sizes are changed in kernels containing clock drivers. Internal pin connections are varied in IO kernels. Via placement is changed in the kernels connecting the IO power ring to power pads. The procedure recognizes what version should be placed and chooses the correct one.

The size and location of the columns and rows are critical design characteristics in the physical architecture of the chips, and are defined primarily by user or customer requirements. Once known, the location of any column and row intersection can be calculated knowing the sequence of column/row types between that intersection and an origin. Also, the names of the nets that are connected to kernel pins can be calculated. This is the underlying calculation the procedure, discussed below, uses to place and wire the kernels.

The procedure accepts as an input parameter the number of sectors in the desired IC and the procedure cycles through all column and row intersections processing the appropriate kernel for each intersection. The X,Y placement location (relative to an arbitrarily placed origin) is calculated and the kernel layout and schematic instances at the X,Y location are placed. Net names are calculated for each kernel pin and the pins are appropriately labeled with the calculated net names.

The column and row sizes (i.e., widths and heights) can also be linked to packaging requirements. As columns and rows are added to the IC, more wirebond pads and solder bumps must also be added. Since the chips grow by adding sector columns and rows, and each sector may require, for example, thirteen wirebond pads, the width of a sector must equal at least the pitch of the thirteen wirebond pads. (The metal bumps for each sector require less space than the wirebond pads so they are not the critical dimension.) These are all design constraints when the column and row sizes are initially chosen. In the exemplary embodiment of FIG. 2, the width of one repeater column plus one jumper column plus two CoreCellQuad columns represents the width of a sector and therefore the pitch of thirteen wirebond pads.

Thus, the primary characteristics of the physical architecture of a desired IC are:

Column and row partitions or regions covering the entire IC;

Kernel placement and wiring at column and row intersections;

Kernel width and height matching column width and row height;

Column and row sizes linked to packaging requirements; and

Logical architecture represented as repeatable blocks that are placed in patterns around the chip.

Using these characteristics, the place and wire procedure can generate multiple sizes from the same layout and schematic building blocks (i.e., kernels).

Figure 3:
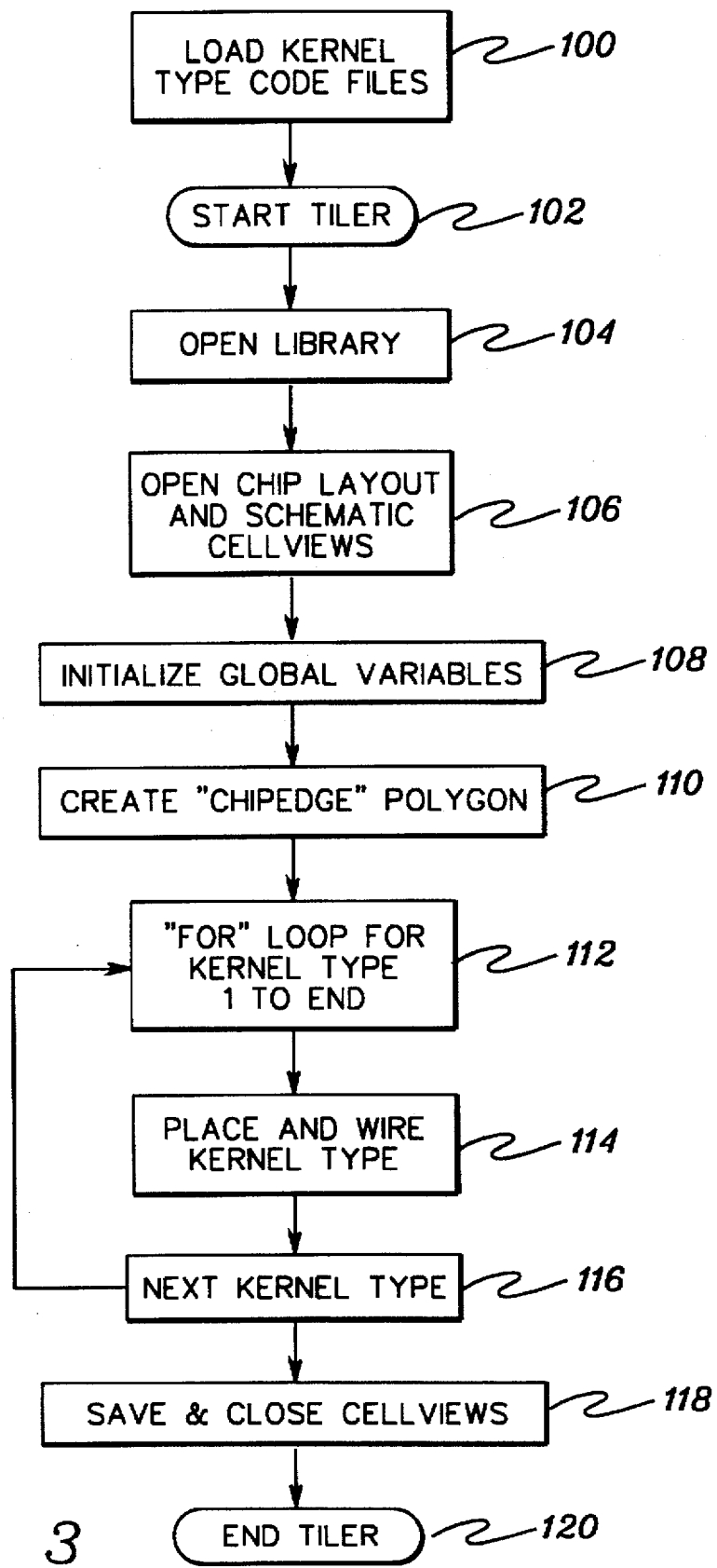
FIG. 3 is a flow diagram of the procedure employed to produce layout and schematics for a single member of an IC family in accordance with the principles of the present invention.
Figure 4:
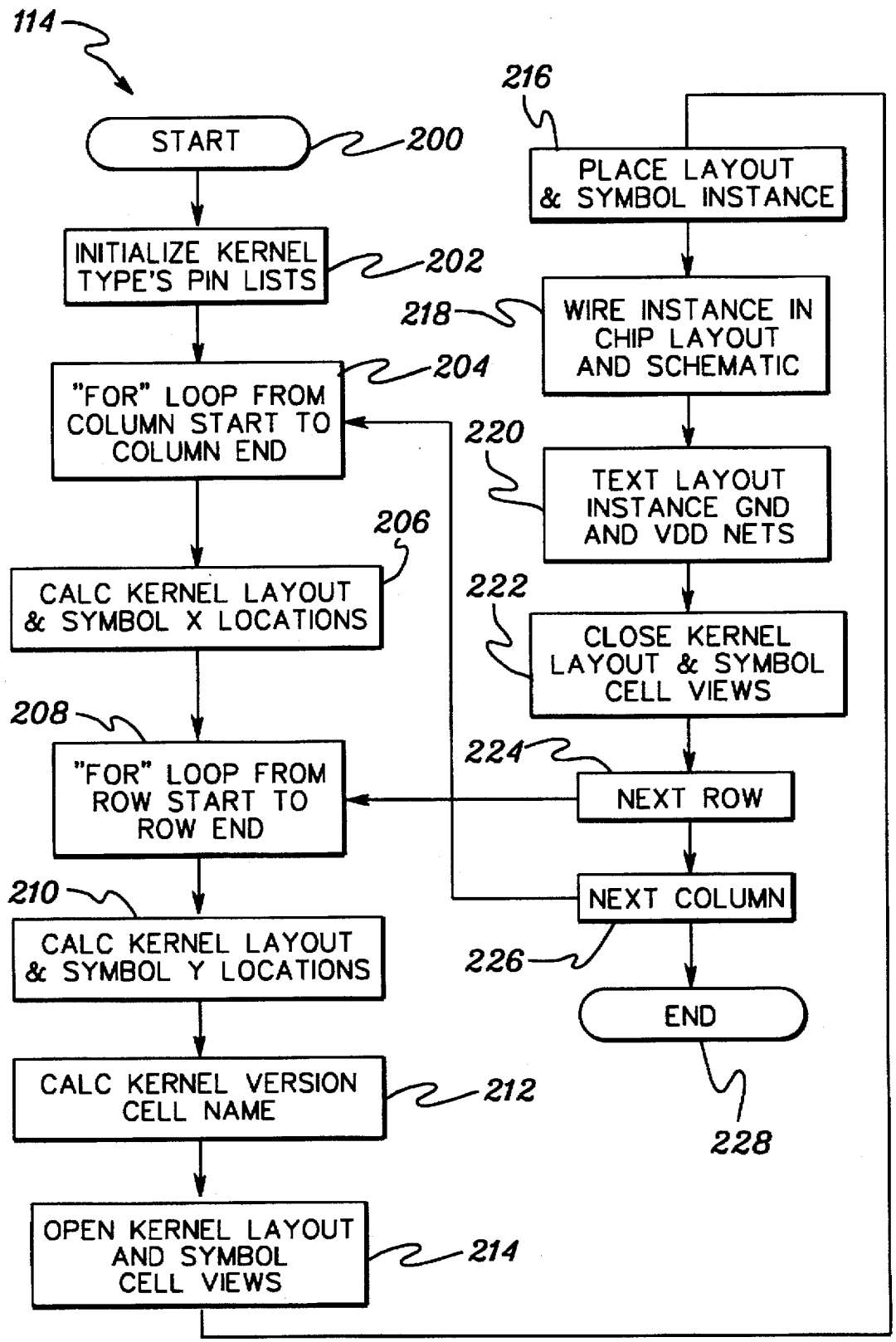
FIG. 4 is a flow diagram of the procedure employed to place the kernels within each kernel type according to the principles of the present invention.

With reference to FIGS. 3 and 4, shown therein are exemplary embodiments of the procedures for automatically producing layout and schematic data for each IC size within a family of IC sizes, according to the present invention. These procedures place and wire repeatable layout and schematic building blocks (kernels) to form the completed IC. This process can be referred to as "tiling" and the procedures can be referred to as the "tiler."

The output of the tiler procedures is layout and schematic data. Layout data is most commonly transferred to, and used by, the fabrication facility for actually fabricating the chip. Schematic data is often used by the designers for additional design tasks, including verification and/or test. Most layout connections are formed by abutments. When kernels are placed next to each other, tabs on the edges of each kernel touch and form connections. In a few cases, the tiler procedure draws wires and/or vias to form connections. For all layout connections, the tiler labels the pin net with its chip level net name. Schematic connections are formed by labelling. All pins on a kernel schematic instance are labelled with its chip level net name. Connections are formed when pins are assigned to the same chip level net name.

Those skilled in the art will recognize that the terms "place" and/or "route" encompass steps in the design process wherein a circuit is assigned a location and wiring, possibly in a software tool which produces digital dam to be provided to a fabrication facility. These terms thus are not limited to the actual fabrication process when an actual physical circuit is placed and routed in silicon.

An exemplary embodiment of a main tiler procedure is depicted in the flow diagram of FIG. 3. In step 100 "LOAD KERNEL TYPE CODE FILES," each kernel type's code file is loaded which drives a kernel type's placement and wiring. At this point, the number and physical make-up of row and column types, and therefore kernel types, has been determined by the circuit designers as set forth above. These files represent this information and are provided to the tiler for the automated place and wire step for each family member. These files are loaded each time the main procedure is loaded.

Step 102 "START TILER"0 begins the tiler procedure. Step 104 "OPEN LIBRARY" opens the library where the IC layout data is to be deposited. Its name can be the first parameter of the tiler function call. Step 106 "OPEN CHIP LAYOUT AND SCHEMATIC CELL VIEWS" opens the chip layout and schematic views wherein which the placed and wired IC data is to be deposited. The cell name may be the second parameter of the tiler function call. In step 108, "INITIALIZE GLOBAL VARIABLES," five exemplary primary layout dimensions and five exemplary primary symbol dimensions are initialized based on the exemplary five column and row types discussed above. The five primary layout dimensions are used for chip layout data, and the five primary symbol dimensions are used for chip schematic data. These values are thereafter stored in global variables for access by the following routines. Step 110, "CREATE CHIP EDGE POLYGON," simply writes some introductory information to the chip layout cell view. Those skilled in the art will recognize that steps 100–110 are exemplary only, and are merely introductory steps in the particular embodiment disclosed for preparing the processing environment for the subsequent place and route procedure.

Step 112 "FOR LOOP FOR KERNEL TYPE 1 TO END" begins a loop within which a place and wire procedure is performed for each kernel type. As discussed above, five distinct column and row types are defined for the exemplary FPGA IC disclosed herein. One can thus expect to process twenty-five different kernel types. Each kernel within the kernel type is similarly formed and represents an intersection between a given type of column with a given type of row.

Step 114, "PLACE AND WIRE KERNEL TYPE" is a procedure, discussed below with reference to FIG. 4, within which each kernel within the current kernel type is placed and wired based on the number of sectors desired for the family member being processed. This parameter may be specified in a third parameter of the tiler procedure call.

Step 116, "NEXT KERNEL TYPE" simply checks to determine whether all the kernel types have been placed and wired, and if not, returns processing to steps 112 and 114 for placement and wiring of the next kernel type.

Step 118 "SAVE AND CLOSE CELL VIEWS" and step 120 "END TILER" are conventional steps which follow completion of the place and route procedure for all kernel types.

With reference to FIG. 4, shown therein is a detailed flow diagram for step 114 "PLACE AND WIRE KERNEL TYPE" of FIG. 3. Step 200 "START" initiates this procedure. Step 202 "INITIALIZE KERNEL TYPES PIN LIST" initializes kernel version pin lists for the kernel versions within each kernel type. As discussed above, multiple kernels are usually expected to be placed while processing a kernel type, unless only one row and one column of the given type are present in the array. However, each kernel type may also have a variable number of versions based upon particular wiring requirements in a chip.

Step 204 "FOR LOOP FROM COLUMN START TO COLUMN END" initiates a loop within which columns relevant to the kernel type are processed for placement and routing of each kernel in the kernel type. If the kernel type is defined by a column type of which there is only a single occurrence in the array, this loop would merely occur only one time. Step 206 "CALCULATE KERNEL LAYOUT AND SYMBOL X LOCATIONS" calculates the X coordinates based on the current column information and primary kernel heights and widths. Thus, for each column processed in the loop, a different X location results based on the location of that column and the types of columns located between an origin defined in the chip and the current column. Thus, while only the column types relevant to the current kernel type are processed within the loop, the procedure nevertheless requires information on the overall sequence of column types between the origin and the current column in order to correctly calculate the X location.

In step 208 "FOR LOOP FROM ROW START TO ROW END" initiates a loop within which all of the rows relevant to the particular kernel type are processed. Again, if only one row is relevant, this loop only occurs one time.

Step 210 "CALCULATE KERNEL LAYOUT AND SYMBOL Y LOCATIONS" is the step within which the Y coordinates of the kernel are calculated based on the current row information and a primary kernel type's heights and widths. Again, as discussed above regarding the X locations, the procedure requires information regarding the number and types of rows between the origin and the current row.

Step 212 "CALCULATE KERNEL VERSION CELL NAME" is the step within which the cell name is calculated based on the current column and row location. (The phrase cell name is used to indicate a particular kernel version name.) The kernel name and kernel pin list variables are set accordingly. If only one kernel version exists for the current IC size, its name can be calculated before the column loop starts. In step 214 "OPEN KERNEL LAYOUT AND SYMBOL CELL VIEWS," the kernel's layout and symbol cell views are opened. Again, if only one kernel version exists for the current IC size, kernels can be opened before the column loop starts.

In step 216 "PLACE LAYOUT AND SYMBOL INSTANCE," the instance name is calculated and placed in IC layout and schematic cell views at the X and Y coordinates calculated above. (The term instance is used to indicate a particular instantiation of a cell or kernel version at a particular location. Multiple such instances may occur.) In step 218, "WIRE INSTANCE IN CHIP LAYOUT AND SCHEMATIC," layout and symbol instances are wired in the chip data. Again, most connections in the layout are linked by abutment (kernel has pads on its edge that touch corresponding tabs on adjacent kernels). In certain cases, wires and vias may be drawn. All layout instance pin nets are labelled with a chip level net name. Connections in the chip schematic are linked by labelling. A chip level net name is attached to every schematic instance port. Common net names on a port connect the ports together.

In step 220 "TEXT LAYOUT INSTANCE GND AND VDD NETS," all ground and VDD text shapes are copied from a layout kernel to the chip layout and offset by the kernel instance X,Y. In step 222 "CLOSE KERNEL LAYOUT AND SYMBOL CELL VIEWS," the kernel layout and symbol cell views are closed. If only one kernel version exists for the current IC size, the kernels may be closed after the column loop end. Steps 224 and 226 end the row and column loops, respectively. A test is performed to determine whether any additional rows or columns can be processed for the current kernel type. The procedure ends with step 228.

The tiler procedure can be repeated using a different desired FPGA size for as many family members as are desired. The tiler is thus a significant improvement over prior techniques because of the decreased amount of manual intervention required during the place and route phase of chip design for family members which can be formed from a common heterogeneous set of building blocks or kernels.

The method and system of the present invention can be implemented in many commonly known computer-aided design workstation environments. An example of one such environment 300 is shown in FIG. 5. A computer workstation 330, connected to network 320, and having standard storage devices 310 (along with internal RAM, not shown) is provided. In one exemplary embodiment, the SKILL language within Cadence "Design Framework II" is employed on a RS6000/AIX workstation. The online documents available with Design Framework II version 4.2.2, including at least: "DFW II User's Guide," Reference, "SKILL Fundamentals," 1993, are hereby incorporated herein by reference. The layout information is produced in DFII format, and can be easily converted to GDS or GL1 format, which are both digital formats suitable to transfer for fabrication facilities for IC fabrication. In addition, the schematic data may be retained by the IC designers for subsequent verification and test.

By employing the method and system of the present invention, a family of IC sizes can be designed and fabricated once basic building blocks or kernels for the family have been defined. Although the arrays involved are heterogeneous in nature, the automated methods and systems herein utilize the repetitive nature of the circuit types in order to automatically place and wire, and produce layouts and schematics for, an entire family of IC sizes with very little manual intervention.

While the invention has been described in detail herein in accordance with certain preferred embodiments thereof, many modifications and changes therein may be effected by those skilled in the art. Accordingly, it is intended by the following claims to cover all such modifications and changes as fall within the true spirit and scope of the invention.

What is claimed is:

1. A method for heterogeneous array design, comprising:
defining a plurality of column circuit types, each column circuit type having associated therewith a column width, at least two of the column widths being different;
defining a plurality of row circuit types, each row circuit type having associated therewith a row height, at least two of the row heights being different;
allocating the pluralities of row and column circuit types to respective row and column regions in the array, the allocated pluralities of row and column circuit types forming a plurality of intersecting regions across the array; and
arranging circuits into kernels corresponding to respective intersecting regions according to the width of the column circuit type and the height of the row circuit type which form the respective intersecting region.

2. A program storage device readable by a machine, tangibly embodying a data structure generated by the method steps of claim 1 for heterogeneous array design.

3. The method of claim 1, wherein each of at least a portion of the column circuit types has a corresponding row circuit type, the width of each column circuit type of the portion of the column circuit types being generally equivalent to the height of its corresponding row circuit type.

4. The method of claim 1, wherein one of the column circuit types and a corresponding row circuit type each comprises a cruciform circuit type to be allocated to central regions in the array.

5. The method of claim 1, wherein one of the column circuit types and a corresponding row circuit type each comprises a perimeter circuit type to be allocated to perimeter regions in the array.

6. The method of claim 1, further comprising:

placing the arranged kernels into kernel positions in the array, the kernel positions being determined as a function of the location of their respective intersecting regions in the array.

7. The method of claim 6, wherein the step of placing includes:

calculating a kernel position for at least one of the arranged kernels, the kernel position calculated as a function of the number, type and width of any column regions between the respective intersecting region and an origin, and as a function of the number, type and height of any row regions between the respective intersecting region and the origin.

8. The method of claim 6, wherein the step of placing the arranged kernels is repeated for each member of a family of heterogeneous arrays, each member being generally characterized by the number and type of row and column circuit types allocated thereto.

9. A program storage device readable by a machine, tangibly embodying a data structure generated by the method steps of claim 6 for heterogeneous array design.

10. The method of claim 1, further comprising:

placing each respective arranged kernel in the array according to a two-dimensional coordinate system having an origin, a first coordinate being determined as a function of the widths of the allocated column types between the origin and the respective intersecting region, and a second coordinate being determined as a function of the heights of the allocated row types between the origin and the respective intersecting region.

11. A program storage device readable by a machine, tangibly embodying a data structure generated by the method steps of claim 10 for heterogeneous array design.

12. A method for placing a plurality of kernels in a heterogeneous array, the array being characterized by a plurality of columns each having a column circuit type and a plurality of rows each having a row circuit type, the method comprising:

providing a description of a plurality of kernel types, the plurality of kernels being grouped within the kernel types of the plurality of kernel types, at least one kernel type being generally defined by the intersection of a column having a given column circuit type and a row having a given row circuit type; and calculating at least one kernel placement position for a kernel of the at least one kernel type as a function of the location in the array of the column having the given column circuit type by which the at least one kernel type is defined and the row having the given row circuit type by which the at least one kernel type is defined.

13. The method of claim 12, further including:

calculating kernel positions for the remaining kernels of the at least one kernel type, the number of remaining kernels of the at least one kernel type being determined as a function of the number in the array of each row and column circuit type by which the at least one kernel type is defined.

14. The method of claim 13, further including:

calculating kernel positions for the kernels of the remaining kernel types, the number of kernels of each remaining kernel type being determined as a function of the number in the array of each row and column circuit type by which the respective kernel type is defined.

15. A program storage device readable by a machine, tangibly embodying a program of instructions executable by the machine to perform the method steps of claim 14 for placing a plurality of kernels in a heterogeneous array.

16. A program storage device readable by a machine, tangibly embodying a program of instructions executable by the machine to perform the method steps of claim 13 for placing a plurality of kernels in a heterogeneous array.

17. The method of claim 12, wherein two of the plurality of rows of the array are located along opposite perimeter regions of the array and have perimeter circuit types and two of the plurality of columns of the array are located along opposite perimeter regions of the array and have perimeter circuit types.

18. The method of claim 12, wherein the heterogeneous array comprises a plurality of logic cells partitioned into sectors, each sector being defined by the intersection of a plurality of adjacent columns and a plurality of adjacent rows, the plurality of adjacent columns having a given sequence of column circuit types and the plurality of adjacent rows having a given sequence of row circuit types.

19. The method of claim 18, wherein the steps of providing and calculating at least one kernel placement position are repeated for each member of a family of heterogeneous circuit arrays, each member of the family being generally characterized by the number of sectors therein.

20. The method of claim 12, wherein the steps of providing and calculating at least one kernel placement position are repeated for each member of a family of heterogeneous circuit arrays, each member of the family being generally characterized by the size thereof.

21. A program storage device readable by a machine, tangibly embodying a program of instructions executable by the machine to perform the method steps of claim 12 for placing a plurality of kernels in a heterogeneous array.

22. The method of claim 12, wherein a first coordinate of the calculated placement position and a second coordinate of the calculated placement position correspond to distances from an origin in a two-dimensional coordinate system used to lay out the array, and wherein the step of calculating includes:

determining, for the first coordinate, the number, type and width of any columns between the column and the origin; and determining, for the second coordinate, the number, type and height of any rows between the row and the origin.

23. The method of claim 12, wherein one of the plurality of rows of the array is centrally located in the array and has a first central circuit type and one of the plurality of columns of the array is generally centrally located and has a second central circuit type.

24. A system for placing a plurality of kernels in a heterogeneous array, the array being characterized by a plurality of columns each having a column circuit type and a plurality of rows each having a row circuit type, the system comprising:

a data structure having a description of a plurality of kernel types, the plurality of kernels being grouped within the kernel types of the plurality of kernel types, at least one kernel type being generally defined by the intersection of a column having a given column circuit type and a row having a given row circuit type; and means for calculating at least one kernel placement position for a kernel of the at least one kernel type as a function of the location in the array of the column having the given column circuit type by which the at least one kernel type is defined and the row having the given row circuit type by which the at least one kernel type is defined.

25. The system of claim 24, further including:

means for calculating kernel positions for the remaining kernels of the at least one kernel type, the number of remaining kernels of the at least one kernel type being determined as a function of the number in the array of each row and column circuit type by which the at least one kernel type is defined.

26. The system of claim 25, further including:

means for calculating kernel positions for the kernels of the remaining kernel types, the number of kernels of each remaining kernel type being determined as a function of the number in the array of each row and column circuit type by which the respective kernel type is defined.

27. The system of claim 24, wherein a first coordinate of the calculated placement position and a second coordinate of the calculated placement position correspond to distances from an origin in a two-dimensional coordinate system used to lay out the array, and wherein the means for calculating includes:

means for determining, for the first coordinate, the number, type and width of any columns between the column and the origin; and means for determining, for the second coordinate, the number, type and height of any rows between the row and the origin.

28. The system of claim 24, wherein one of the plurality of rows of the array is generally centrally located in the array and has a first central circuit type and one of the plurality of columns of the array is generally centrally located and has a second central circuit type.

29. The system of claim 24, wherein two of the plurality of rows of the array are located along opposite perimeter regions of the array and have perimeter circuit types and two of the plurality of columns of the array are located along opposite perimeter regions of the array and have perimeter circuit types.

30. The system of claim 24, wherein the heterogeneous array comprises a plurality of logic cells partitioned into sectors, each sector being defined by the intersection of a plurality of adjacent columns and a plurality of adjacent rows, the plurality of adjacent columns having a given sequence of column circuit types and the plurality of adjacent rows having a given sequence of row circuit types.

31. The system of claim 30, further including means for repeating the calculating for each member of a family of heterogeneous circuit arrays, each member of the family being generally characterized by the number of sectors therein.

32. The system of claim 24, further including means for repeating the calculating for each member of a family of heterogeneous circuit arrays, each member of the family being generally characterized by the size thereof.

* * * * *

UNITED STATES PATENT AND TRADEMARK OFFICE
CERTIFICATE OF CORRECTION

PATENT NO. : 5,734,582
DATED : Mar. 31, 1998
INVENTOR(S) : Bertolet et al.

It is certified that error appears in the above-identified patent and that said Letters Patent is hereby corrected as shown below:

Column 8, line 17,   "Step 102 "START TILER"0" should read --Step 102 "START TILER"--

Signed and Sealed this

Fifteenth Day of December, 1998

Attest:

BRUCE LEHMAN

Attesting Officer        Commissioner of Patents and Trademarks